United States Patent
Olson (10) Patent No.: US 9,653,339 B2
(45) Date of Patent: May 16, 2017

(54) INTEGRATED SHIELDING FOR WAFER PLATING

(75) Inventor: Tim Olson, Phoenix, AZ (US)

(73) Assignee: Deca Technologies Inc., Tempe, AZ (US)

( * ) Notice: Subject to any disclaimer, the term of this patent is extended or adjusted under 35 U.S.C. 154(b) by 623 days.

(21) Appl. No.: 13/028,380

(22) Filed: Feb. 16, 2011

(65) Prior Publication Data

US 2011/0308955 A1 Dec. 22, 2011

Related U.S. Application Data

(60) Provisional application No. 61/305,121, filed on Feb. 16, 2010.

(51) Int. Cl.
| | | |
|---|---|---|
| C25D 17/06 | (2006.01) | |
| C25D 7/12 | (2006.01) | |
| C25D 17/00 | (2006.01) | |
| H01L 21/687 | (2006.01) | |

(52) U.S. Cl.
CPC ........ H01L 21/68728 (2013.01); C25D 7/123 (2013.01); C25D 17/001 (2013.01); C25D 17/008 (2013.01); C25D 17/06 (2013.01); H01L 21/68764 (2013.01)

(58) Field of Classification Search
CPC ... C25D 17/06; C25D 17/08; H01L 21/68728; H01L 21/67712; H01L 21/67359
USPC ............ 204/297.12, 297.11, 297.05; 205/96; 30/297.12, 297.11, 297.05
See application file for complete search history.

(56) References Cited

U.S. PATENT DOCUMENTS

| | | | | |
|---|---|---|---|---|
| 2,751,345 | A * | 6/1956 | Osman .................. | C25D 17/06 204/297.05 |
| 4,259,166 | A * | 3/1981 | Whitehurst .......... | C25D 17/008 204/279 |
| 5,316,642 | A * | 5/1994 | Young et al. ................. | 204/198 |
| 6,423,636 | B1 * | 7/2002 | Dordi .................. | H01L 21/2885 257/E21.175 |
| 6,569,302 | B1 * | 5/2003 | Steinrucke ................. | 204/297.1 |
| 6,780,294 | B1 * | 8/2004 | Hixson et al. ........... | 204/298.11 |
| 7,070,686 | B2 * | 7/2006 | Contolini ............. | C25D 17/008 204/212 |
| 7,172,184 | B2 | 2/2007 | Pavani et al. | |

(Continued)

FOREIGN PATENT DOCUMENTS

| | | |
|---|---|---|
| WO | 2009085337 A2 | 7/2009 |
| WO | 2010054677 A1 | 5/2010 |

OTHER PUBLICATIONS

International Search Report of the International Searching Authority for Application No. PCT/US11/25127 dated May 17, 2011; 3 pages.

(Continued)

*Primary Examiner* — Louis Rufo
(74) *Attorney, Agent, or Firm* — Booth Udall Fuller, PLC (57) ABSTRACT

A semiconductor substrate carrier for use during wet chemical processing may comprise a conductive flange to couple the carrier with processing equipment, a frame coupled with the conductive flange, where the frame is configured to hold a semiconductor substrate, and an integrated shield coupled with the frame. The integrated shield is configured to alter an electric field near at least a portion of a surface of the semiconductor substrate during the wet chemical processing.

27 Claims, 8 Drawing Sheets

(56) References Cited

U.S. PATENT DOCUMENTS

| | | | |
|---|---|---|---|
| 7,445,697 B2 * | 11/2008 | Keigler et al. | 204/297.01 |
| 7,608,174 B1 * | 10/2009 | Hachman et al. | 204/297.01 |
| 7,622,024 B1 * | 11/2009 | Mayer et al. | 204/198 |
| 7,807,027 B2 | 10/2010 | Yoshioka et al. | |
| 7,875,158 B2 | 1/2011 | Kuriyama et al. | |
| 2004/0175504 A1 | 9/2004 | Hasselblatt et al. | |
| 2005/0051437 A1 | 3/2005 | Kurashina et al. | |
| 2008/0152922 A1 | 6/2008 | Cheng et al. | |

OTHER PUBLICATIONS

International Written Opinion of the International Searching Authority for Application No. PCT/US11/25127 dated May 17, 2011; 9 pages.

* cited by examiner

INTEGRATED SHIELDING FOR WAFER PLATING

RELATED APPLICATIONS

This application claims the benefit of U.S. Provisional Application No. 61/305,121, filed on Feb. 16, 2010.

TECHNICAL FIELD

This disclosure relates to the field of semiconductor device manufacturing and, in particular, to an integrated shield for use in wet chemical processing of a substrate.

BACKGROUND

Integrated circuits are formed through a process known as semiconductor device fabrication. The semiconductor device may be formed on a thin slice, or wafer, of semiconductor material, such as silicon crystal. The wafer serves as a substrate for microelectronic devices built on the wafer. During fabrication of these integrated circuits, the silicon wafer is put through a sequence of wet chemical processing steps. One wet chemical processing step in the sequence is electrochemical deposition, commonly known as electroplating.

In the electroplating process, electrical current is used to deposit metal ions from a solution onto a wafer, forming a film or patterned structure of metal on the wafer. Certain semiconductor packaging technologies, such as Wafer Level Chip Scale Packaging and Flip Chip, involve multiple electroplating steps. Many electroplating processes make use of semiconductor fabrication plant (fab) equipment. The fab equipment is designed to plate a single wafer at a time causing the electroplating process to be slow. The fab equipment is also typically very expensive. In addition, downtime is common due to high maintenance requirements and plating chemistries are expensive due to the small quantities used. These factors result in a high cost per wafer to perform electroplating.

Plating equipment used in other industries, including batch and continuous processing systems used in traditional semiconductor packaging are considerably less expensive and more efficient than the fab equipment. This plating equipment may include that used for printed circuit boards or leadframe plating lines. Such plating equipment provides typical throughputs which are approximately ten times greater than that of fab equipment at a cost that is typically half that of the fab equipment.

BRIEF DESCRIPTION OF THE DRAWINGS

The present disclosure is illustrated by way of example, and not by way of limitation, in the figures of the accompanying drawings.

DETAILED DESCRIPTION

The following description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in a simple block diagram format in order to avoid unnecessarily obscuring the present invention. Thus, the specific details set forth are merely exemplary. Particular implementations may vary from these exemplary details and still be contemplated to be within the spirit and scope of the present invention.

Described herein is a method and apparatus for a semiconductor substrate carrier having an integrated shield. Such a carrier may hold a semiconductor substrate wafer during electroplating or other wet chemical processing of the substrate using low cost, printed circuit board or leadframe style plating equipment.

A carrier with integrated shielding may allow a significant cost reduction for one of the most expensive process steps in creating a wafer-level chip scale package (WLCSP) or wafer bump, which is the electroplating process. In one embodiment, the semiconductor substrate carrier may be used to electroplate 200 mm and 300 mm semiconductor wafers on low cost, in-line plating equipment such as those used to plate leadframe packages. In one embodiment, the integrated shielding may be used to control uniformity of the thickness of the plating across the substrate.

The current industry standard for electroplating semiconductor substrate wafers to create a WLCSP or bump structure involves use of a single wafer, fab style machine such as a SemiTool Raider platform. These machines typically run at 10 to 20 wafers per hour and may cost approximately 4 million dollars. In one embodiment, a semiconductor substrate carrier with integrated shielding may enable the use of well proven, low cost leadframe strip plating or similar equipment to create the WLCSP and bump structures. Plating semiconductor substrate wafers using these inline strip type machines will enable a throughput on the order of 100 to 200 wafers per hour, while the cost of the machine may be much lower, at approximately 2 million dollars.

In one embodiment, an integrated circuit (IC) or discrete semiconductor wafer may be automatically placed into a semiconductor substrate carrier with integrated shielding. The carrier may be loaded onto a belt, transfer arm(s), flight bar(s) or other transport mechanisms of the electroplating equipment. The transport mechanism(s) may move the semiconductor substrate through various chemicals to accomplish the electroplating or other wet chemical process. Once the process is complete, the wafer may be automatically removed from the carrier.

In one embodiment, the carrier may be single sided such that the carrier holds a single wafer. Alternatively, the carrier may be dual sided and may hold two wafers. A dual sided carrier may be used to approximately double the throughput of an in-line plating system.

Depending on the embodiment, the substrate held in the carrier may be any of a number of different substrate types. For example, the substrate may be a crystalline substrate, such as a semiconductor wafer, a composite material such as a laminate substrate or molded structure, a flex circuit or polymer based structure, a metallic substrate, or other type of substrate. As an example, further description herein will be in terms of a wafer and the carrier may be referred to as a wafer carrier, however, this description shall not be construed as limiting in any way.

Figure 1:
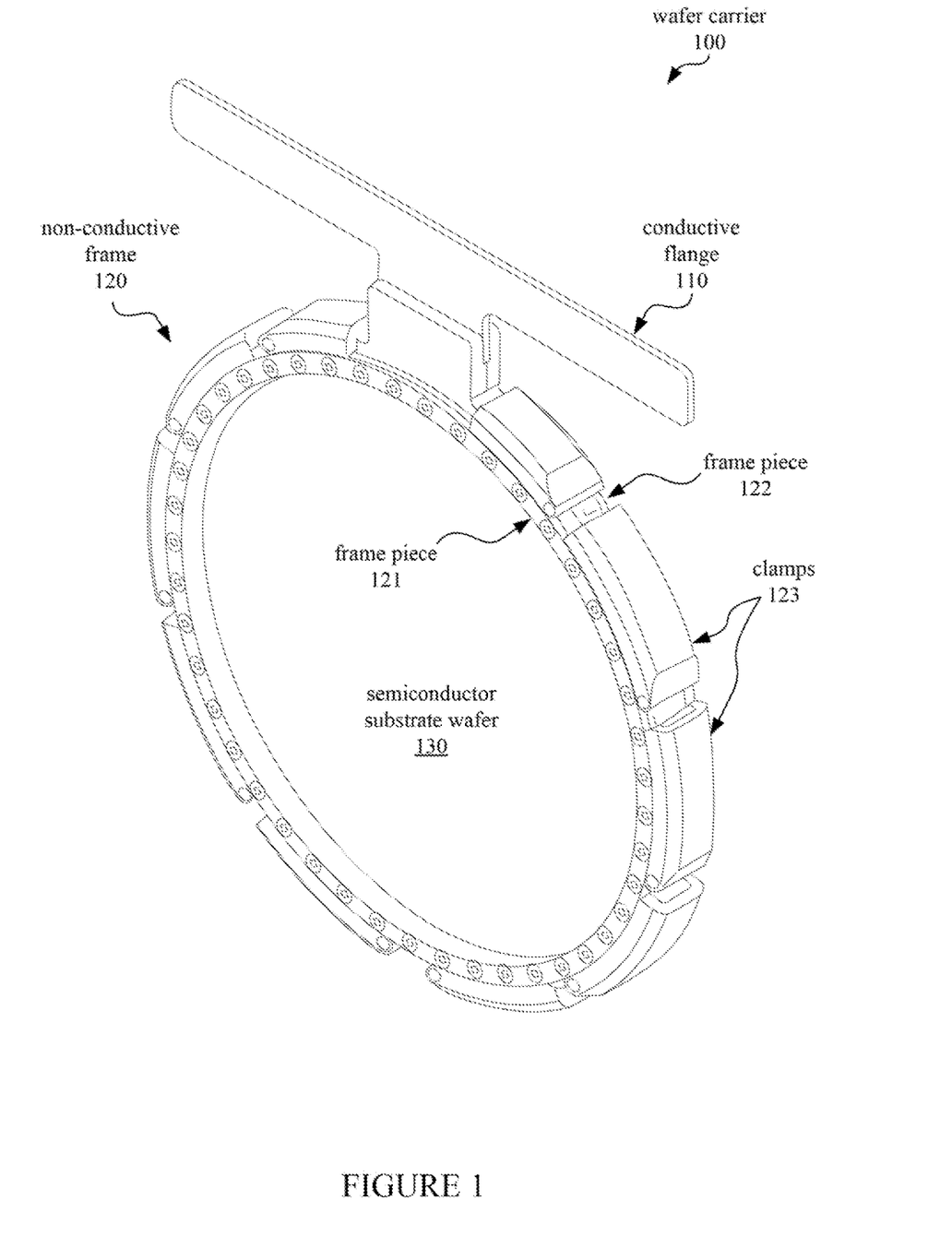
FIG. 1 illustrates an embodiment of a semiconductor substrate carrier.

FIG. 1 is a diagram illustrating a wafer carrier 100, which is one embodiment of a semiconductor substrate carrier. The wafer carrier 100 includes a conductive flange 110 which couples the wafer carrier 100 to a machine transport mechanism within a plating machine (not shown). In one embodiment, the processing equipment may include an in-line plating machine. The in-line plating machine may be similar to equipment used in leadframe strip plating lines. Leadframe strip plating lines are well established in the packaging industry and may generally suspend and traverse conductive copper leadframes on a metal belt through a sequence of steps in the plating process. In another embodiment, the wafer carrier may be used with rack style plating equipment such as that used in electroplating of printed circuit boards. In other embodiments, some other transport mechanism may be used.

Conductive flange 110 emulates a leadframe and may be used to create a temporary mechanical and electrical connection to a conductive metal transfer belt of the plating equipment. In one embodiment, the conductive flange 110 attaches to the transport mechanism of the plating equipment and allows the wafer carrier 100 to be advanced through the plating machine. Electrical contact may be established between the plating machine and the conductive flange enabling a plating electrical circuit to be selectively established when the carrier and semiconductor substrate 130 is suspended by the machine transport mechanism in a wet chemical bath during processing. In one embodiment, the wafer carrier may maintain low resistance electrical contact between the conductive flange and the outer 2.5 mm edge of the semiconductor substrate wafer 130 for carrying high plating currents.

In one embodiment conductive flange 110 may be formed from stainless steel, although in other embodiments, conductive flange 110 may be formed from another conductive material such as, for example, copper, another metal, or a non-metal conductive material. In one embodiment, the neck of a conductive flange, which is a portion of the conductive flange connected with the frame 120, may be shorter or longer than the neck of conductive flange 110, as illustrated in FIG. 1. In one embodiment, the length of the neck may be adjustable.

In one embodiment, conductive flange 110 is thin enough to afford it some degree of flexibility. In certain in-line plating machines, the belt may be curved around drums as the belt changes direction. The conductive flange 110, when attached to the belt, may be sufficiently flexible to also curve around the drums. In one embodiment, conductive flange 110 may be flexible enough to bend in an arc having a radius of approximately 24 inches.

Wafer carrier 100 also includes non-conductive frame 120 that prevents plating of anything except an outer surface of the semiconductor wafer 130. For example, the non-conductive frame may prevent plating of contacts, wafer sides, the wafer back, or elements of the carrier itself. Nonconductive frame 120 is coupled to conductive flange 110 so that non-conductive frame 120 is able to be suspended from the machine transport mechanism of the plating machine. In one embodiment, non-conductive frame 120 is formed from a ring of nonconductive material, such as for example chlorinated polyvinyl chloride (CPVC). In other embodiments, other non-conductive materials may be used. Non-conductive frame 120 may be formed into a ring of non-conductive material having an inside diameter slightly smaller than the diameter of the wafer 130 to be electroplated. For example, nonconductive frame 120 may be sized appropriately to hold a 200 millimeter (mm) or a 300 mm silicon wafer. In other embodiments, non-conductive frame 120 may be sized to hold a wafer having some other size.

In one embodiment, non-conductive frame 120 may be formed from two separate frame pieces 121 and 122. Frame pieces 121 and 122 may be identical or substantially identical having one or more built-in clamps 123 to hold the pieces 121 and 122 together. In one embodiment, the frame pieces 121 and 122 clamp together to create a sealed assembly that prevents process chemicals from attacking or plating electrical contacts, as well as sides and back of wafer 130. In one embodiment, a vacuum test system may be used to ensure adequate sealing for each wafer loaded into the carrier.

In one embodiment, each frame piece is identical and includes half of the total number of clamps. In other embodiments, the clamps 123 may all be included on one frame piece or arranged between the two frame pieces in some other proportion. In one embodiment, each frame piece 121 and 122 holds a wafer such as wafer 130 and the frame pieces 121 and 122 are secured together with the wafers being oriented parallel to one another and held together by clamps 123 to form non-conductive frame 120. The frame pieces 121 and 122 may be oriented so that the wafers are back-to-back, with the front side of each wafer facing out. Optionally, a spacer or spacers may be placed in between the two wafers within the frame assembly to provide a compliant layer. In one embodiment, the frame can hold two semiconductor substrates or one substrate and one dummy structure to handle uneven batch sizes.

In one embodiment, the frame pieces 121 and 122 may be secured together using magnets instead of clamps. For example, one or both of frames 121 and 122 may include a series of magnets spaced around the perimeter for attaching the frame 121 or 122 to another frame piece. In one embodiment, the magnets may be recessed into one or both of the frame pieces 121 and 122.

Figure 2A:
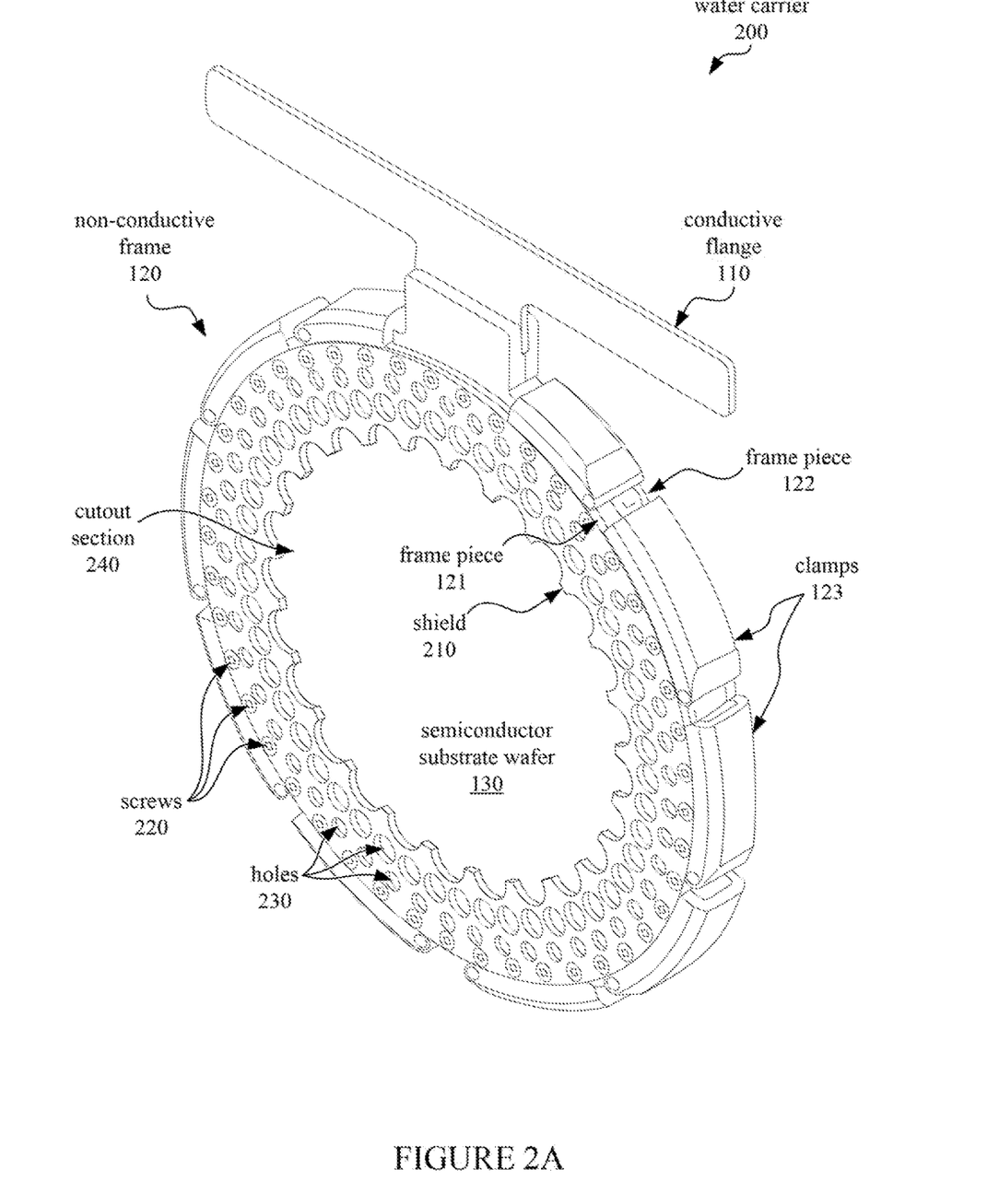
FIG. 2A illustrates an embodiment of a semiconductor substrate carrier having an integrated shield with holes.

FIG. 2A illustrates an embodiment of a wafer carrier 200 having an integrated shield 210. In one embodiment, the integrated shielding 210 affects the electrical field within the plating process enabling deposition of a uniform thickness across the area of the wafer 130. In an alternative embodiment, the integrated shielding 210 may also be used to restrict or control the flow of liquid during wet chemical processing of the wafer 130. In one embodiment, the shield 210 may be made from plastic or some other non-conductive material.

In one embodiment, the shield 210 is attached to the non-conductive frame 120. For example, shield 210 may be attached to frame piece 121 of the frame 120 using one or more fasteners such as screws 220 or some type of snap or sliding fit fasteners. In one embodiment, the screws 220 are arranged along the perimeter of the shield 210. In one embodiment where two semiconductor wafers such as wafer 130 may be held within the carrier 200, fasteners such as screws 220 may be used in similar fashion to attach a second shield (not shown) to frame piece 122.

In one embodiment, one or more retaining guides may be attached to one of the frame pieces 121 or 122 to form a slot into which shield 210 may be inserted and held in place parallel to a wafer 130.

In one embodiment, the shield 210 has one or more holes 230 or cutout sections such as cutout section 240 designed to control the electrical field or the flow of plating fluid or other liquid chemical near the surface of the wafer 130 during wet chemical processing. In one embodiment, the area corresponding to the cutout section 240 and the holes 230 decreases nearer to the edges of the shield 210 such that the flow of ions or plating fluid or other chemical is more restricted near the edges of the wafer 130. For example, the holes 230 nearer to the center of the integrated shield 210 may be larger in diameter than the holes 230 that are nearer to the edge of the shield 210. Alternatively, the holes 230 may be similar in size, and the density of the holes 230 may increase nearer to the center of the shield 210.

In one embodiment, the progressively increasing restriction of ion flow or the flow of plating fluid towards the edges of the wafer 130 counteracts the tendency of thicker plating to be deposited near the edges of the wafer 130 during the plating process. Thus, the shield 210 allows for more uniform plating over the surface of the wafer 130. In one embodiment, the pattern of holes 230 and the size or shape of cutout section 240 may be changed to control the uniformity of the plating for other applications.

Figure 2B:
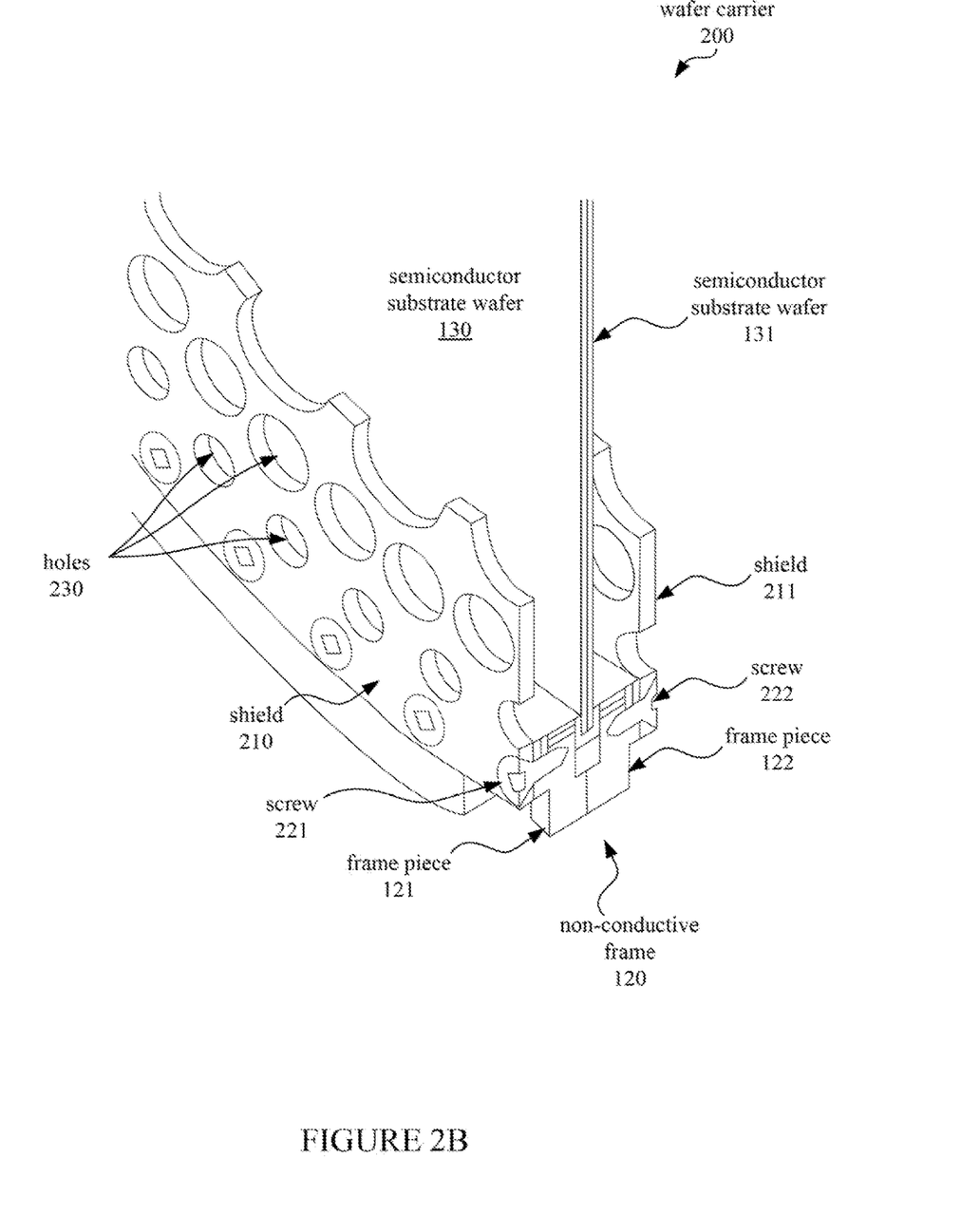
FIG. 2B illustrates a cross section of a semiconductor substrate carrier having an integrated shield, according to an embodiment.

FIG. 2B illustrates a cross section of the wafer carrier 200. Carrier 200 is holding two semiconductor substrate wafers 130 and 131 and has an integrated shield 210 and 211 for each of the wafers 130 and 131, respectively. Shield 210 is attached to the frame piece 121 of non-conductive frame 120 by screws including screw 221, while shield 211 is attached to the other frame piece 122 of non-conductive frame 120 by screws including screw 222.

FIG. 2B illustrates the back-to-back orientation of the wafers 130 and 131 in the carrier 200, in an embodiment of a carrier 200 capable of holding two wafers. In one embodiment, the outer surfaces wafers 130 and 131 are spaced apart from the shields 210 and 211.

Figure 2C:
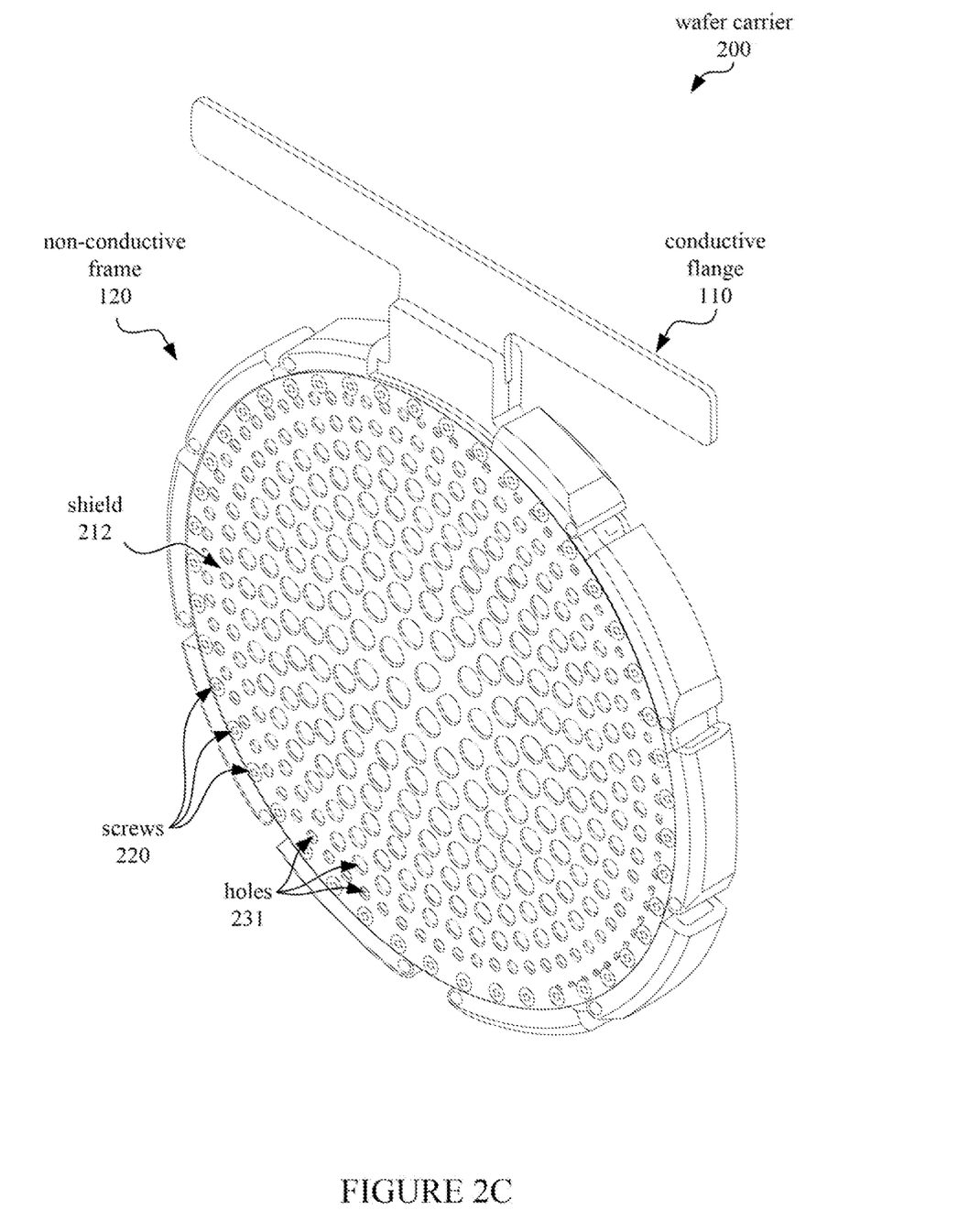
FIG. 2C illustrates an embodiment of a semiconductor substrate carrier having an integrated shield with holes.

FIG. 2C illustrates an embodiment of a wafer carrier 200 having an integrated shield 212 which may be attached to wafer carrier 200 via nonconductive frame 120 in a similar fashion as shield 210. Integrated shield 212 is designed to fully cover a semiconductor wafer held by wafer carrier 200, with the exception of a number of holes 231 distributed across the surface of the shield 212. In one embodiment, the holes 231 are larger near the center of the shield 212 and smaller near the edge of shield 212. For example, the holes 231 may be approximately ¼ inch in diameter near the center and may be approximately 1/16 inches in diameter near the edges. In one embodiment, the sizes of the holes 231 may become progressively larger from the center to the edge of the shield 212.

Figure 3:
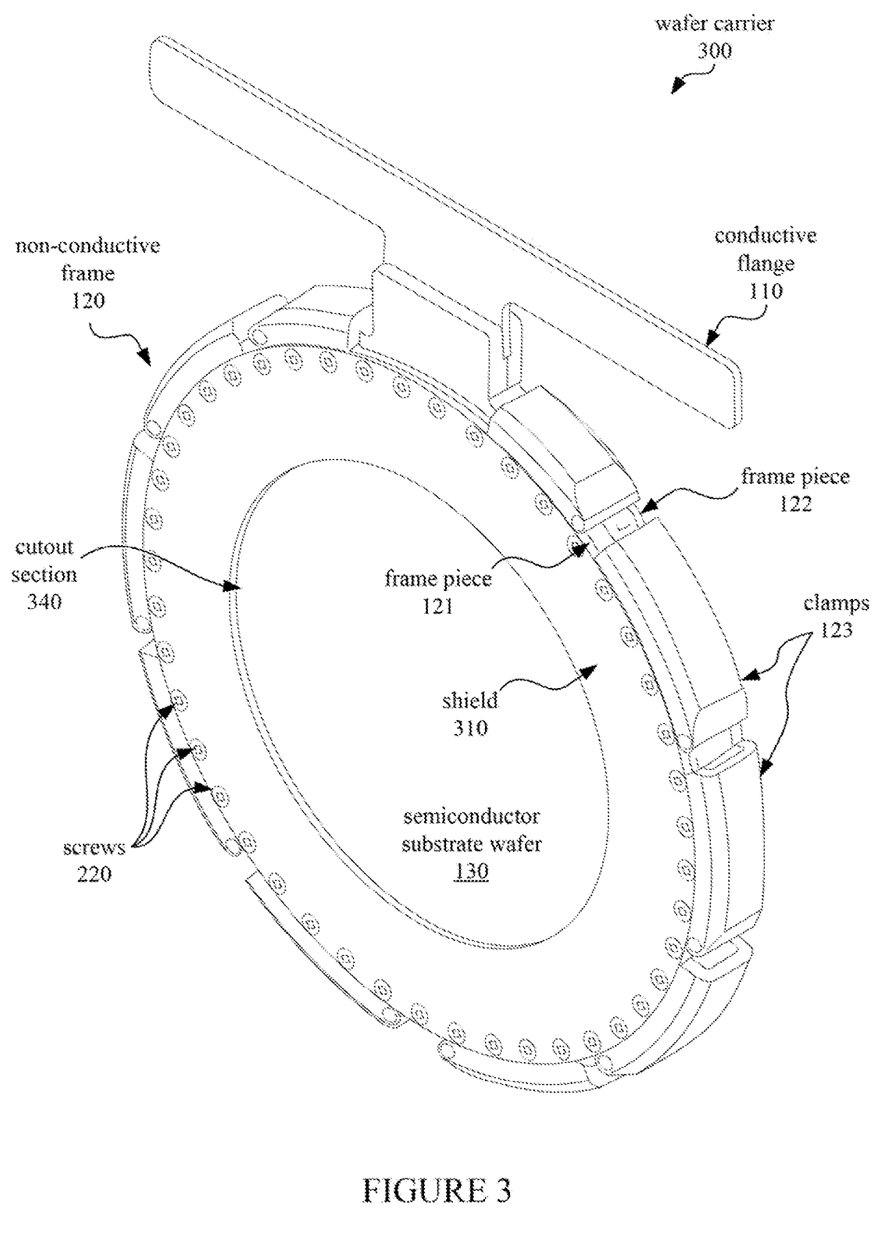
FIG. 3 illustrates an embodiment of a semiconductor substrate carrier with an integrated shield having a central cutout.

FIG. 3 illustrates an embodiment of a wafer carrier 300 having a shield 310 with a single large cutout section 340. The shield 310 restricts the flow of ions in solution or of liquid chemical, such as plating fluid, near the edges of the wafer 130 by blocking the fluid with the solid material of the shield 310. In one embodiment, the shield 310 may be made from plastic or some other non-conductive material.

Figure 4:
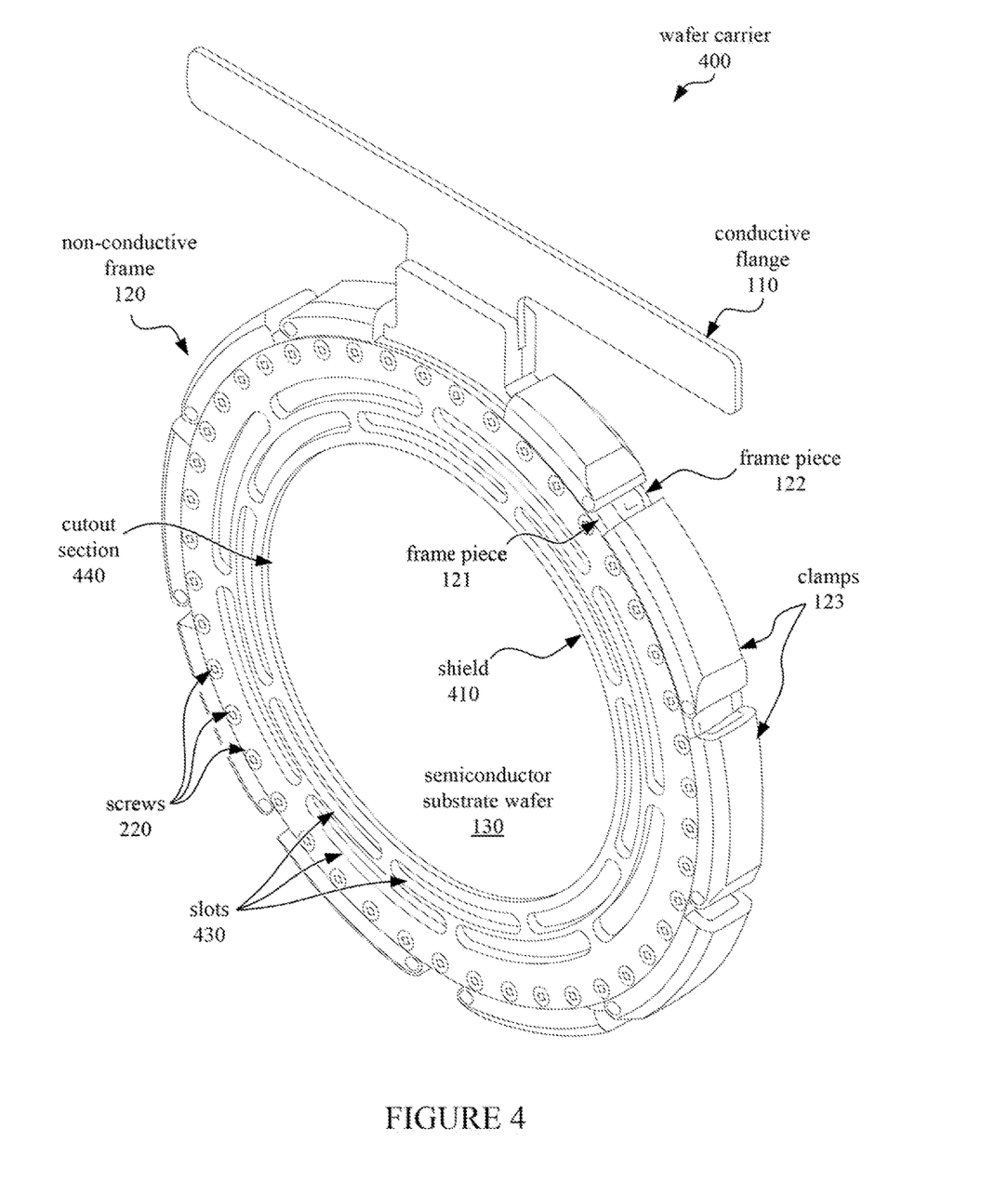
FIG. 4 illustrates an embodiment of a semiconductor substrate carrier with an integrated shield having slot shaped cutouts.

FIG. 4 illustrates an embodiment of a wafer carrier 400 having a shield 410 with a cutout section 440 and several slot-shaped holes 430. In one embodiment, the slots 430 are arranged around a perimeter of the shield 410. The shield 410 can thus restrict the flow of ions in solution or of liquid chemical, such as plating fluid, near the edges of the wafer 130, while the cutout section 440 allows for less restricted flow of the liquid chemical near the center of the wafer 130. In one embodiment, the shield 410 may be made from plastic or some other non-conductive material.

Figure 5:
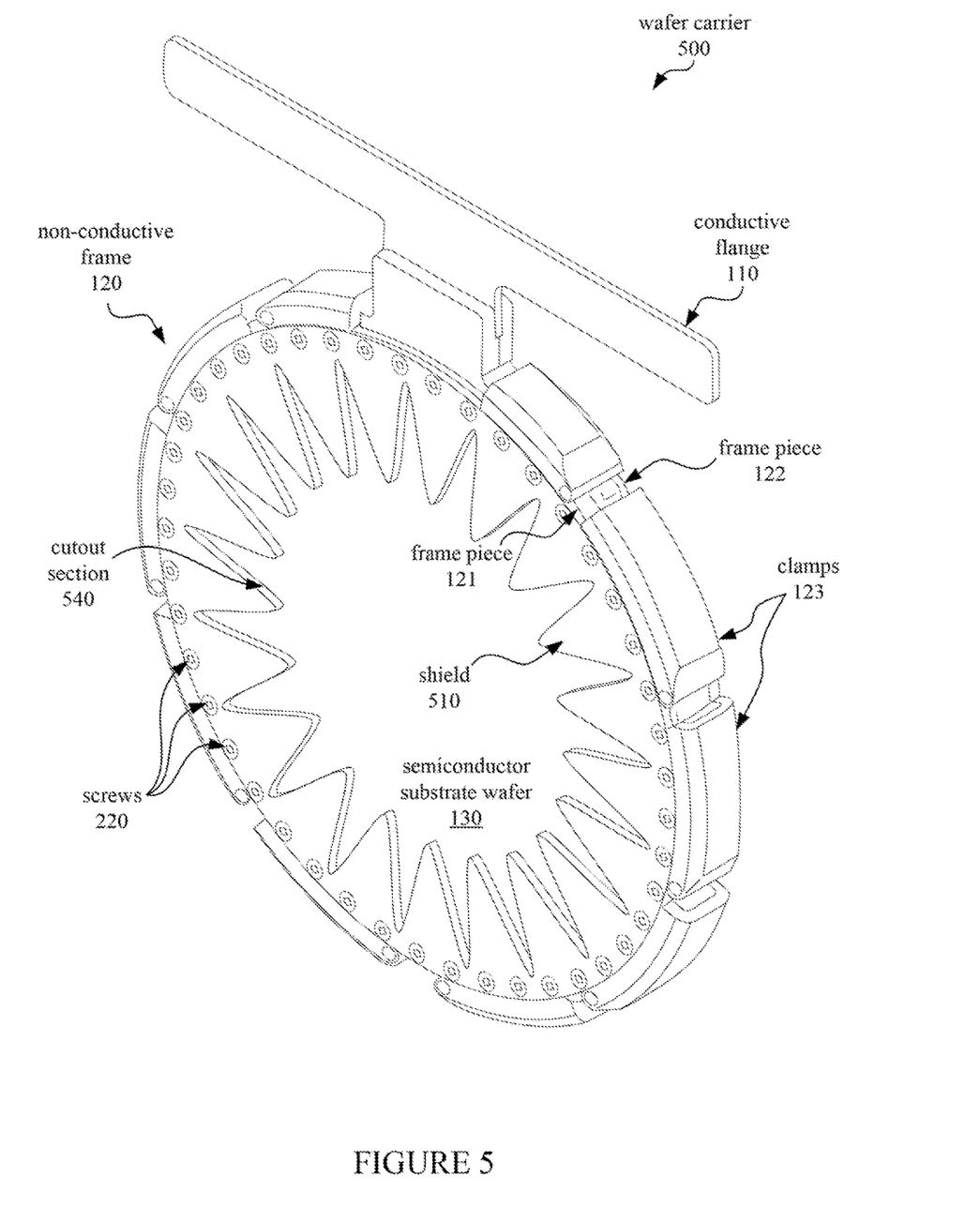
FIG. 5 illustrates an embodiment of a semiconductor substrate carrier with an integrated shield having a star shaped cutout.

FIG. 5 illustrates an embodiment of a wafer carrier 500 having an integrated shield 510 with a star-shaped cutout section 540. The area of the cutout section 540 includes several outwardly radiating points that taper as they approach the edges of the shield 510. Thus, the shield 510 has more solid material to restrict the flow of ions in solution or of liquid chemical, such as plating fluid, near the edges of the wafer 130. In one embodiment, the shield 510 may be made from plastic or some other non-conductive material.

The wafer carrier with integrated shield could also be used on more conventional rack type plating lines in either single or dual configurations. It would also be possible to extend the concept to 4, 8 or perhaps more wafers depending upon the size of the wafers and practical limitations. In one embodiment, the wafer carrier with integrated shield may be used to hold 200 & 300 mm semiconductor wafers. Alternatively, a wafer carrier with integrated shield could also be used for other size semiconductor wafers such as 4 inch, 5 inch, 150 mm or perhaps someday, 450 mm. The wafer carrier could also be used for plating solar wafers.

In addition to the electrochemical deposition, the wafer carrier described herein may be used during other wet chemical processing steps. These processing steps may include for example, plating pattern resist strip, etching of the seed layer metal, or other processes. During electroplating, a template formed from a plating pattern resist, such as a photoresist, is applied to the surface of the wafer, covering a portion of the surface. The uncovered portion of the wafer surface is electroplated. In a subsequent processing step, the plating pattern resist is removed during plating pattern resist strip. A seed layer metal on the wafer, which may be formed from titanium-tungsten and copper, is removed through an etching process. Etchants are applied to the wafer to remove the exposed seed layer metal. In one embodiment, the wafer carrier may hold the wafers during these and other processes.

Figure 6:
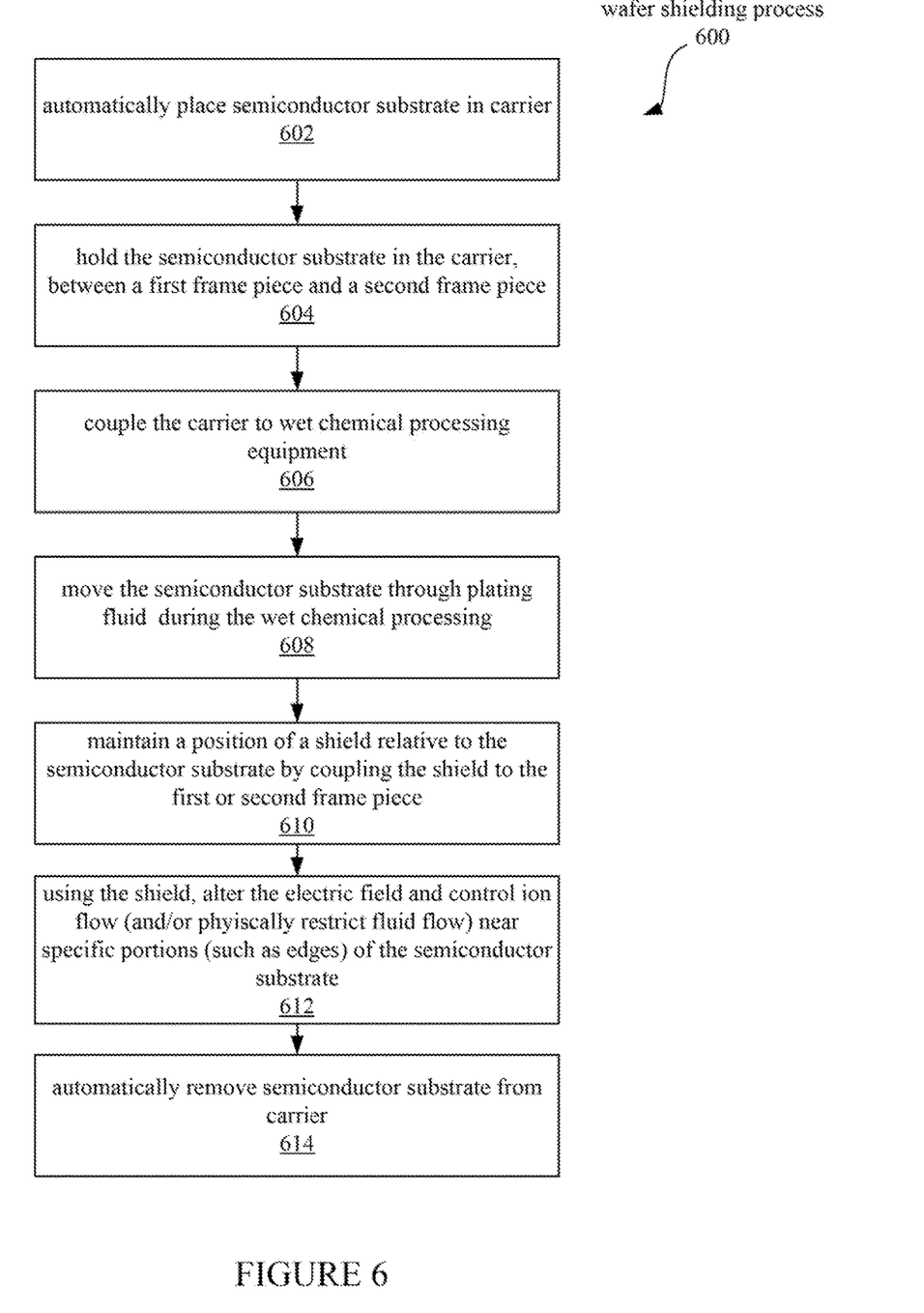
FIG. 6 is a flow diagram illustrating a process for using a semiconductor substrate with an integrated shield, according to an embodiment.

FIG. 6 is a flow diagram illustrating a process 600 for shielding a semiconductor wafer during a plating process or other wet chemical process. In one embodiment, the shielding process 600 may be performed by a wafer carrier such one of wafer carriers 200, 300, 400, or 500, as illustrated in FIGS. 2A-5.

The process 600 begins at block 602. At block 602, the semiconductor substrate wafer is automatically placed in a wafer carrier prior to wet chemical processing. In one embodiment, the wet chemical processing may be an electroplating process.

From block 602, the process 600 continues at block 604. At block 602, the wafer carrier is used to hold the semiconductor substrate wafer between a first frame piece and a second frame piece of the wafer carrier. For example, the wafer 130 may be held between frame pieces 121 and 122 of non-conductive frame 120, as illustrated in FIGS. 2A and 2B. In one embodiment, the wafer carrier may hold two wafers 130 and 131 between the frame pieces 121 and 122. The frame pieces 121 and 122 may be held together by clamps 123 to form a non-conductive frame 120 holding the wafers 130 and 131.

From block 604, the process 600 continues at block 606. At block 606, the carrier is coupled with wet chemical processing equipment. For example, a wafer carrier 200 may have a conductive flange 110 that may be attached to a belt which is driven by the processing equipment. In one embodiment, the conductive flange 110 emulates a leadframe in a leadframe plating machine, such that an electrical connection may be established between the plating equipment and the wafer 130 through the conductive flange 110. The plating machine may thus apply the appropriate potentials to the wafer during the wet chemical processing.

From block 606, the process 600 continues at block 608. At block 608, the processing equipment moves the wafer carrier through plating fluid or some other liquid chemical during the wet chemical process. For example, the belt to which the wafer carrier 200 is attached may be used to convey the wafer carrier 200, along with the wafer 130, through a liquid chemical, such as plating fluid.

From block 608, the process 600 continues at block 610. At block 610, the carrier maintains a position of a shield relative to the semiconductor substrate wafer by coupling the shield to a frame piece. For example, with reference to FIG. 2A, the shield 210 may be fastened to the frame piece 121 of the non-conductive frame 120 by screws 220. The screws 220 hold the shield 210 so that it remains in a fixed position relative to the wafer 130 for the duration of the plating process or other wet chemical process. In one embodiment, the shield 210 may already be attached to the frame piece when the wafer 130 is placed in the carrier 200 at block 602.

From block 610, the process 600 continues at block 612. At block 612, the shield alters the electric field to restrict the flow of ions and may physically restrict the flow of plating fluid or another liquid chemical near specific portions of the semiconductor substrate. In one embodiment, the flow of ions or fluid is progressively more restricted towards the edges of the wafer, and is less restricted near the center of the wafer. For example, the shield 210 may have holes 230 and a cutout section 240 such that the area corresponding to the holes 230 or the cutout section 240 is greater near the center of the shield 210. The shield 210 may thus allow greater flow of ions or fluid through the large cutout section 240 near the center of the wafer 130, and more restricted flow of ions or fluid through the smaller holes 230 near the edges of the wafer 130. The flow of ions and liquid chemical, such as plating fluid, is thus controlled during the electroplating processor other wet chemical process. In one embodiment, use of the shield 210 results in a more uniform plating thickness across the surface of the wafer 130.

From block 612, the process 600 continues at block 614. At block 614, the semiconductor substrate wafer is automatically removed from the carrier. For example, after the plating or other wet chemical process is completed for a wafer 130, the wafer 130 may be automatically removed from the wafer carrier 200.

In one embodiment, the operations represented by blocks 602-614 of process 600 may be performed during wet chemical processing to control the flow of a liquid chemical near the surface of the semiconductor substrate. In one embodiment, the process 600 may be used to ensure an even deposit of plating material over the surface of the semiconductor substrate.

Embodiments of the present invention, described herein, include various operations. These operations may be performed by hardware components, software, firmware, or a combination thereof. Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner. As used herein, the term "coupled to" may mean coupled directly or indirectly through one or more intervening components.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

What is claimed is:

1. A semiconductor substrate carrier in combination with a first semiconductor substrate and a second semiconductor substrate for continuous processing with low cost leadframe strip plating equipment and without semiconductor fabrication plant (fab) equipment 100-200 wafers per hour, comprising:

a conductive flange configured to couple the carrier with the low cost leadframe strip plating equipment to provide a temporary electrical connection between the continuous processing equipment, the first semiconductor substrate, and the second semiconductor substrate, wherein the conductive flange comprises a flexibility to elastically bend in an arc comprising a radius of 60 centimeters during the continuous processing;

a non-conductive frame coupled with the conductive flange, the frame comprising a first ring-shaped frame piece and a second ring-shaped frame piece positioned opposite the first ring-shaped frame piece, wherein the frame comprises an inside diameter;

the first semiconductor substrate disposed within the frame, wherein the inside diameter of the frame is smaller than a diameter of the first semiconductor substrate and the conductive flange is in electrical contact with an outer 2.5 mm edge of the first semiconductor substrate in a radial direction;

the second semiconductor substrate disposed back-to-back with the first semiconductor substrate within the frame, wherein the inside diameter of the frame is smaller than a diameter of the second semiconductor substrate and the conductive flange is in electrical contact with an outer 2.5 mm edge of the second semiconductor substrate in a radial direction;

a first integrated shield in direct contact with the first ring-shaped frame piece, the first semiconductor substrate disposed in a fixed position between the first ring-shaped piece and the second ring-shaped piece, wherein the first integrated shield is operative to alter an electric field near a portion of a surface of the first semiconductor substrate during wet chemical processing; and a second integrated shield in direct contact with the second ring-shaped frame piece, the second semiconductor substrate disposed in a fixed position between the first ring-shaped piece and second ring-shaped piece, wherein the second integrated shield is operative to alter an electric field near at least a portion of a surface of the second semiconductor substrate during wet chemical processing.

2. The semiconductor substrate carrier of claim 1, wherein the integrated shield is further configured to restrict flow of a fluid near at least a portion of the surface of the semiconductor substrate.

3. The semiconductor substrate carrier of claim 1, wherein the integrated shield further comprises at least one coupling device configured to attach the integrated shield to the carrier.

4. The semiconductor substrate carrier of claim 3, wherein the at least one coupling device comprises at least one screw.

5. The semiconductor substrate carrier of claim 3, wherein the at least one coupling device is configured to attach the integrated shield to the frame.

6. The semiconductor substrate carrier of claim 1, wherein the inner diameter of the frame is less than or equal to 5.0 mm smaller than the diameter of the semiconductor substrate.

7. The semiconductor substrate carrier of claim 1, wherein the first integrated shield and the second integrated shield are configured to alter the electric field near an edge of the semiconductor substrate.

8. The semiconductor substrate carrier of claim 7, wherein the first integrated shield and the second integrated shield each comprise a surface comprising one or more holes.

9. The semiconductor substrate carrier of claim 8, wherein a density of the one or more holes is greater nearer to a center of the first semiconductor substrate and the second semiconductor substrate than nearer an edge of the first semiconductor substrate and the second semiconductor substrate.

10. The semiconductor substrate carrier of claim 1, wherein each of the first integrated shield and the second integrated shield comprise a surface comprising a single cutout section comprising a cutout diameter smaller than the inside diameter of the frame.

11. The semiconductor substrate carrier of claim 10, wherein the area of the cutout section is greater nearer a center of the first semiconductor substrate and the second semiconductor substrate than nearer an edge of the first semiconductor substrate and the second semiconductor substrate, respectively.

12. The semiconductor substrate carrier of claim 1, wherein the integrated shield comprises a nonconductive material.

13. The semiconductor substrate carrier of claim 1, wherein the frame is made from a nonconductive material.

14. The semiconductor substrate carrier of claim 1, wherein
a semiconductor wafer is disposed between the first ring-shaped frame piece and the second ring-shaped frame piece.

15. The semiconductor substrate carrier of claim 14, further comprising one or more magnets configured to attach the first ring-shaped frame piece to the second ring-shaped frame piece.

16. A method of using the semiconductor substrate carrier of claim 1, further comprising the throughput of 100-200 wafers per hour with continuous processing with a single piece of low cost leadframe strip plating equipment.

17. A system comprising an apparatus in combination with a semiconductor substrate for continuous processing with low cost leadframe strip plating equipment and without semiconductor fabrication plant (fab) equipment 100-200 wafers per hour, wherein the apparatus comprises:
means for holding the semiconductor substrate;
means for coupling the means for holding with wet chemical processing equipment; means for altering an electric field near a surface of the semiconductor substrate during wet chemical processing; and
first ring-shaped means and second ring-shaped means opposite the first ring shape means for maintaining a position of the means for altering the electric field relative to the semiconductor substrate at a fixed position, the first ring-shaped means directly contacting the second ring-shaped means and directly contacting and integrated with the means for altering an electric field such that the semiconductor substrate is disposed in a fixed position between the first ring-shaped means and the second ring-shaped means.

18. The apparatus of claim 17, wherein the ring-shaped means for maintaining the position of the means for altering the electric field further comprises means for attaching a means for restricting flow with the means for holding the semiconductor substrate.

19. The apparatus of claim 18, wherein the means for restricting flow of a fluid comprises means for restricting flow of the fluid near a surface of a second semiconductor substrate.

20. A system comprising a semiconductor substrate carrier in combination with a semiconductor substrate for continuous processing with low cost lead frame strip plating equipment and without semiconductor fabrication plant (fab) equipment 100-200 wafers per hour, wherein the semiconductor substrate carrier comprises:
a conductive flange configured to couple the carrier with the low cost leadframe strip plating equipment to provide a temporary electrical connection between the plating equipment and the semiconductor substrate:
a frame that comprises a first frame piece and a second frame piece oriented parallel to the first frame piece;
the semiconductor substrate disposed within the frame at a fixed position between the first frame piece and the second frame piece, wherein the conductive flange is adapted to be in electrical contact with an outer edge of the semiconductor substrate; and an integrated shield in direct contact with to the frame.

21. The apparatus of claim 20, wherein the conductive flange forms part of a plating electrical circuit with the semiconductor substrate.

22. The apparatus of claim 20, wherein the integrated shield is operative to alter an electric field near at least a portion of a surface of the semiconductor substrate during wet chemical processing.

23. The apparatus of claim 22, wherein the integrated shield restricts flow of a fluid near at least a portion of the surface of the semiconductor substrate.

24. The apparatus of claim 20, wherein the integrated shield further comprises at least one coupling device configured to attach the integrated shield to the carrier.

25. The apparatus of claim 20, wherein the first frame piece is coupled to the second frame piece with magnets.

26. The apparatus of claim 20, wherein the frame is configured to hold a first semiconductor substrate and a second semiconductor substrate.

27. The apparatus of claim 20, wherein the integrated shield comprises a surface comprising a cutout section that is greater nearer a center of the semiconductor substrate than nearer an edge of the semiconductor substrate.

* * * * *